(12) United States Patent
Nahm et al.

(10) Patent No.: US 7,105,413 B2
(45) Date of Patent: Sep. 12, 2006

(54) METHODS FOR FORMING SUPER-STEEP DIFFUSION REGION PROFILES IN MOS DEVICES AND RESULTING SEMICONDUCTOR TOPOGRAPHIES

(75) Inventors: Jeong-Yeop Nahm, San Jose, CA (US); Helmut Puchner, Santa Clara, CA (US); Oliver Pohland, San Jose, CA (US); Yangzhong Xu, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 11/069,501

(22) Filed: Mar. 1, 2005

(65) Prior Publication Data

US 2005/0215024 A1    Sep. 29, 2005

Related U.S. Application Data

(60) Provisional application No. 60/556,961, filed on Mar. 26, 2004.

(51) Int. Cl.
*H01L 21/336* (2006.01)
(52) U.S. Cl. ........................................ 438/305
(58) Field of Classification Search ............. 438/305, 438/300, 301, 303, 306
See application file for complete search history.

(56) References Cited

U.S. PATENT DOCUMENTS

| | | | |
|---|---|---|---|
| 4,963,502 A * | 10/1990 | Teng et al. | ............... 438/225 |
| 5,908,313 A | 6/1999 | Chau et al. | |
| 6,121,100 A | 9/2000 | Andideh et al. | |
| 6,372,583 B1 | 4/2002 | Tyagi | |
| 6,621,131 B1 | 9/2003 | Murthy et al. | |
| 6,743,684 B1 * | 6/2004 | Liu | ............... 438/300 |
| 6,921,948 B1 * | 7/2005 | Watt | ............... 257/369 |
| 6,943,085 B1 * | 9/2005 | Wang et al. | ............... 438/305 |
| 2003/0080361 A1 | 5/2003 | Murthy et al. | |
| 2003/0197224 A1 | 10/2003 | Song et al. | |

OTHER PUBLICATIONS

Patent Abstracts of Japan, JP 05-029617, Feb. 1993.
International Search Report, PCT/US2005/008177, mailed Jun. 17, 2005.

* cited by examiner

*Primary Examiner*—Scott B. Geyer
*Assistant Examiner*—Amy Mangrum
(74) *Attorney, Agent, or Firm*—Mollie E. Lettang; Kevin L. Daffer; Daffer McDaniel, LLP

(57) ABSTRACT

Methods for fabricating diffusion regions having steep concentration profiles within MOS devices while minimizing junction capacitance degradation are provided. In particular, methods are provided which include patterning a gate structure upon a semiconductor substrate and subsequently etching a recess in exposed portions of the substrate. In some cases, the method includes forming a first dopant region within the exposed portions prior to etching the recess. The method may additionally or alternatively include implanting a second set of dopants into portions of the semiconductor substrate bordering the recess. In either case, the method includes growing an epitaxial layer within the recess and implanting a third set of dopants into the semiconductor topography to form a second dopant region extending to a depth at least within the epitaxial layer. A resulting semiconductor topography includes a source/drain region comprising an upper portion consisting essentially of first dopants of a first conductivity type.

13 Claims, 11 Drawing Sheets

METHODS FOR FORMING SUPER-STEEP DIFFUSION REGION PROFILES IN MOS DEVICES AND RESULTING SEMICONDUCTOR TOPOGRAPHIES

PRIORITY APPLICATION

The present application claims priority to provisional application No. 60/556,961 entitled "Method of Forming Super-Steep Well Profiles on MOS Source/Drain Regions for SRAM Soft Error Rate Improvement" filed Mar. 26, 2004.

BACKGROUND OF THE INVENTION

1. Field of the Invention

The present invention relates generally to processes for fabricating integrated circuits and semiconductor devices, and more particularly to a method of forming MOS devices having steep diffusion region profiles.

2. Description of the Related Art

The following descriptions and examples are given as background information only.

Ion strikes on drain nodes of semiconductor memory devices, such as static random access memory (SRAM) devices for example, can perturb drain node voltages and can flip the state of the device resulting in a single event upset (SEU). In particular, ion strikes can generate electron-hole pairs which travel along the path of a single energetic particle as it passes through the depletion region of memory cells where reverse biasing is applied between a drain region and well of a transistor. Sources of these ion strikes include alpha particles from radioactive materials and particles generated by neutrons from cosmic rays. Due to the rearrangement of charge carriers following an ion strike, a depletion region can collapse and, in turn, funneling from the depletion region can result from minority carrier flow through the substrate. As a consequence, the drain node voltage is perturbed and the state of the memory device may be flipped. The length of the funneling and the time period or duration thereof are dependent on well doping concentration. In some cases, feedback enables or causes the memory device to be flipped continuously until an input is applied to the device. After the depletion region recovers from the ion strikes, holes formed in the well region during funneling are pushed out by an electric field produced by normal biasing and the pre-ion strike potential is restored.

To reduce the occurrence of SEUs, which is commonly referred to as the soft error rate (SER), it is desirable for: (i) the voltage perturbation on drain nodes be as small and short as possible; (ii) recovery be as fast as possible; and (iii) feedback be as slow as possible. Generally, there are three avenues with which to approach resolving or preventing the problems associated with ion strikes. These include intervention at the process technology level, circuit level, and the system level. Typically, circuit and system level approaches reduce performance of memory devices and/or result in a severe area penalty through the addition of devices, such as body taps to the circuits. Several known process level approaches rely on the fact that having higher well doping concentrations improves SER by providing shorter funneling length, higher well conductance, and faster recovery. In addition, higher well conductance may also reduce single event latch-up (SEL) occurrences, which is another type of failure in CMOS technologies. SEL occurs when neighboring NMOS and PMOS regions form parasitic bipolar junction transistor circuits which result in destructive device failure due to excessive substrate current. It is believed that SEL failures can be reduced by decreasing the input node bias values in parasitic bipolar junction transistor circuits. For example, higher well concentrations may be used to in turn produce higher well conductance to decrease the input node bias values.

There are a few approaches that may be used to achieve high doping concentrations in well regions. One utilizes a retrograde well implant before gate definition. Although a retrograde well implant may provide an improvement over previous devices having standard doping in well regions, the level and gradient of impurity concentration within the well (referred to herein as the steepness of the well) is limited by both the design specifications of the ensuing transistor and the fabrication steps used to form the transistor. For instance, an implant dose used to produce a well may be limited by channel region design specifications. In particular, too high of an implant dose for a well region can undesirably affect the doping concentration of a channel region formed for an ensuing gate structure. In addition, the well implants may diffuse during subsequent thermal processing steps used to form the gate structure and, therefore, the concentration and gradient level of impurities within the well may change, and most likely move to leveling out from their implanted state.

Another approach utilizes additional implants after the formation of tip or source/drain regions on opposing sides of a patterned gate structure. The higher well concentration produced by this approach, however, results in higher capacitance at the junction between the source/drain regions and the well region and, consequently, a lower junction breakdown voltage level. Moreover, steepness of the well is limited to the impurity profile as implanted. Another known approach for producing high well doping concentrations includes the use of epitaxial (EPI) wafers or substrates in which retrograde wells are prefabricated. This approach is also not wholly satisfactory for a number of reasons. First, the cost of EPI substrates is substantially more expensive than standard substrates or wafers. Second, EPI substrates are generally formed of one conductivity type. Hence, the benefit of using an EPI substrate to achieve high well concentration is limited only to one type of device, either NMOS or PMOS. Third, in order to effectively reduce the overall SER a very thin EPI layer has to be grown on top of the substrate, causing process control and variability issues. Thus, using EPI substrates is not optimal reducing SER within memory devices.

Accordingly, it would be advantageous to develop a method for producing MOS devices having well regions with steep well profiles, whereby the SER resulting from such devices is improved. It is further desirable that the method improve SEL and MOS performance while minimizing junction capacitance degradation. It is still further desirable that the method also improve short channel effects and contact resistance of the MOS device produced thereby.

SUMMARY OF THE INVENTION

The problems outlined above may be in large part addressed by methods for processing a semiconductor topography to form a MOS device having a diffusion region with a steep profile. The following are mere exemplary embodiments of the methods and resulting semiconductor topography and are not to be construed in any way to limit the subject matter of the claims.

One embodiment of the methods includes patterning one or more layers of the semiconductor topography to form a gate structure above a semiconductor substrate of the semiconductor topography. The method further includes implanting a first set of dopants into the semiconductor topography to form a first dopant region within a portion of the semiconductor substrate adjacent to the gate structure and etching a recess in the portion of the semiconductor substrate adjacent to the gate structure to a depth within the first dopant region. After the recess has been etched, the method includes growing an epitaxial layer within the recess and implanting a second set of dopants into the semiconductor topography to form a second dopant region extending to a depth at least within the epitaxial layer.

Another embodiment of the methods include patterning one or more layers of the semiconductor topography to form a gate structure above a semiconductor substrate of the semiconductor topography and etching a recess in the portion of the semiconductor substrate adjacent to the gate structure. The method further includes implanting a first set of dopants into first portions of the semiconductor substrate bordering the recess and growing an epitaxial layer within the recess subsequent to implanting the first set of dopants. Subsequent to growing the epitaxial layer, the method includes implanting a second set of dopants into the semiconductor topography to form a second dopant region extending to a depth at least within the epitaxial layer.

An embodiment of the semiconductor topography includes source and drain regions arranged on opposing sides of a gate structure, wherein at least one of the source and drain regions comprises an upper portion consisting essentially of first dopants of a first conductivity type and a lower boundary comprising substantially equal concentrations of the first dopants and second dopants of a second conductivity type. The semiconductor topography also includes an additional dopant region arranged beneath the lower boundary comprising a higher concentration of the second dopants than the first dopants.

BRIEF DESCRIPTION OF THE DRAWINGS

These and various other features and advantages of the present invention will be apparent upon reading of the following detailed description in conjunction with the accompanying drawings and the appended claims provided below, where:

Figure 1:
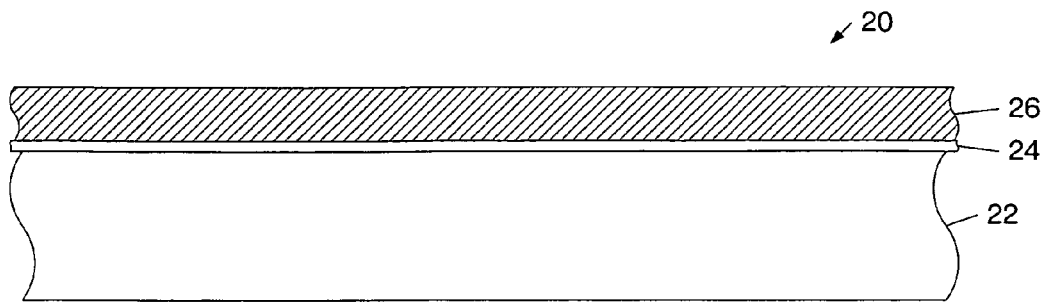
FIG. 1 is a partial cross-sectional view of a semiconductor topography in which a dielectric layer and a conductive layer have been formed upon a semiconductor substrate.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 10:
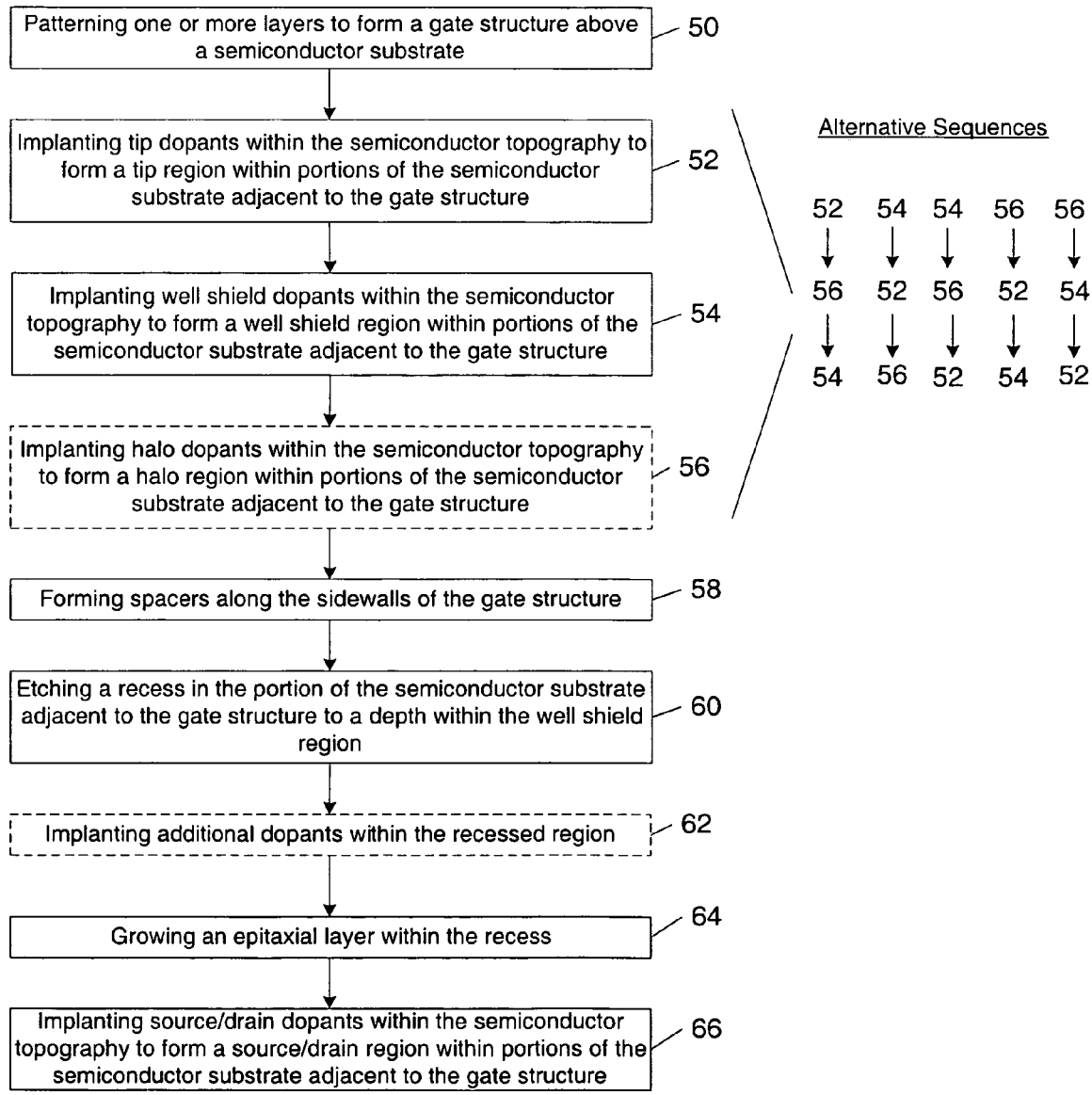
FIG. 10 is a flowchart outlining the sequence of process steps described in reference to FIGS. 1–9 as well as alternative sequences of such process steps.
Figure 11:
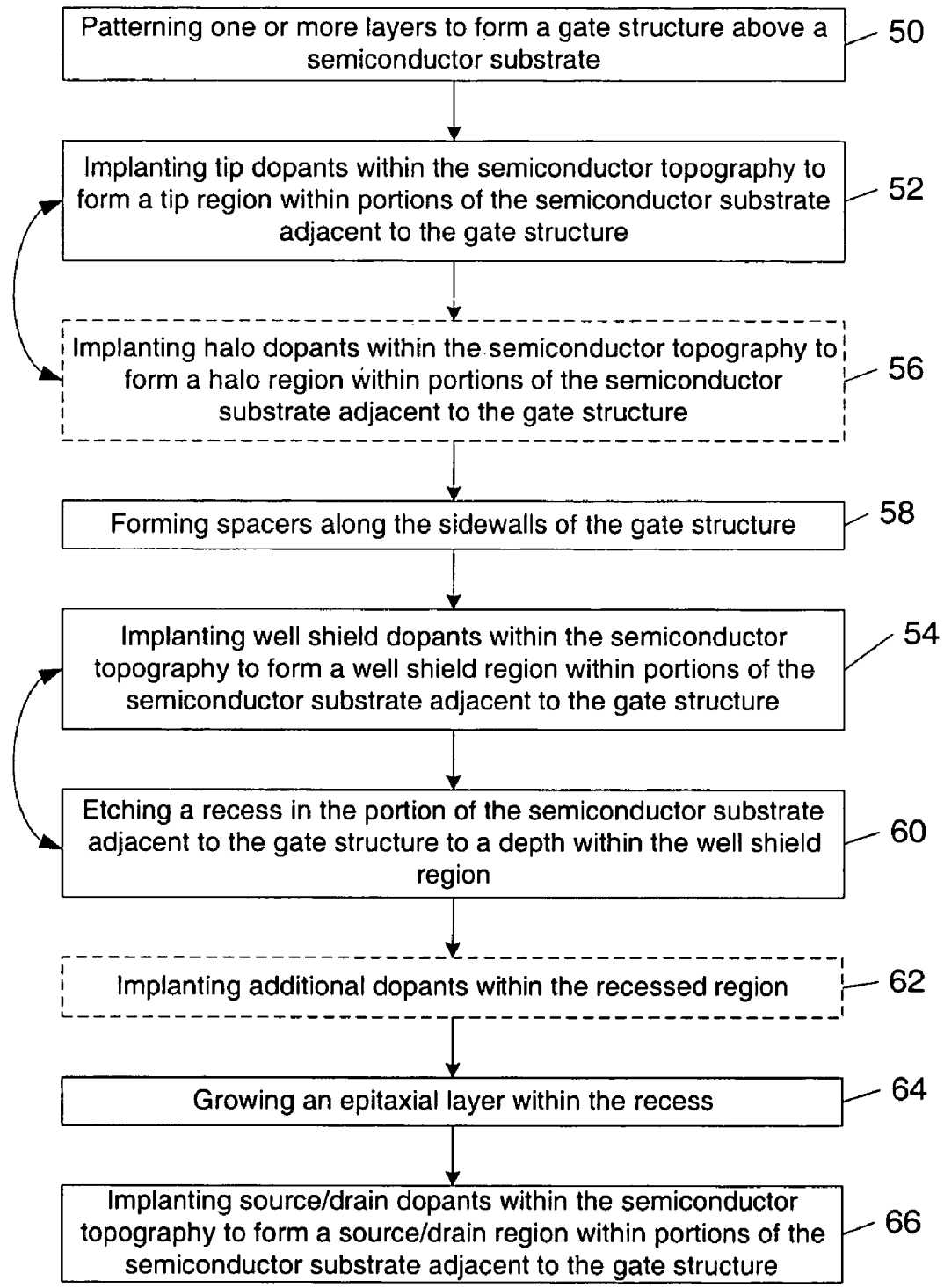
FIG. 11 is a flowchart outlining alternative sequences of the process steps described in reference to FIGS. 1–9.
Figure 12:
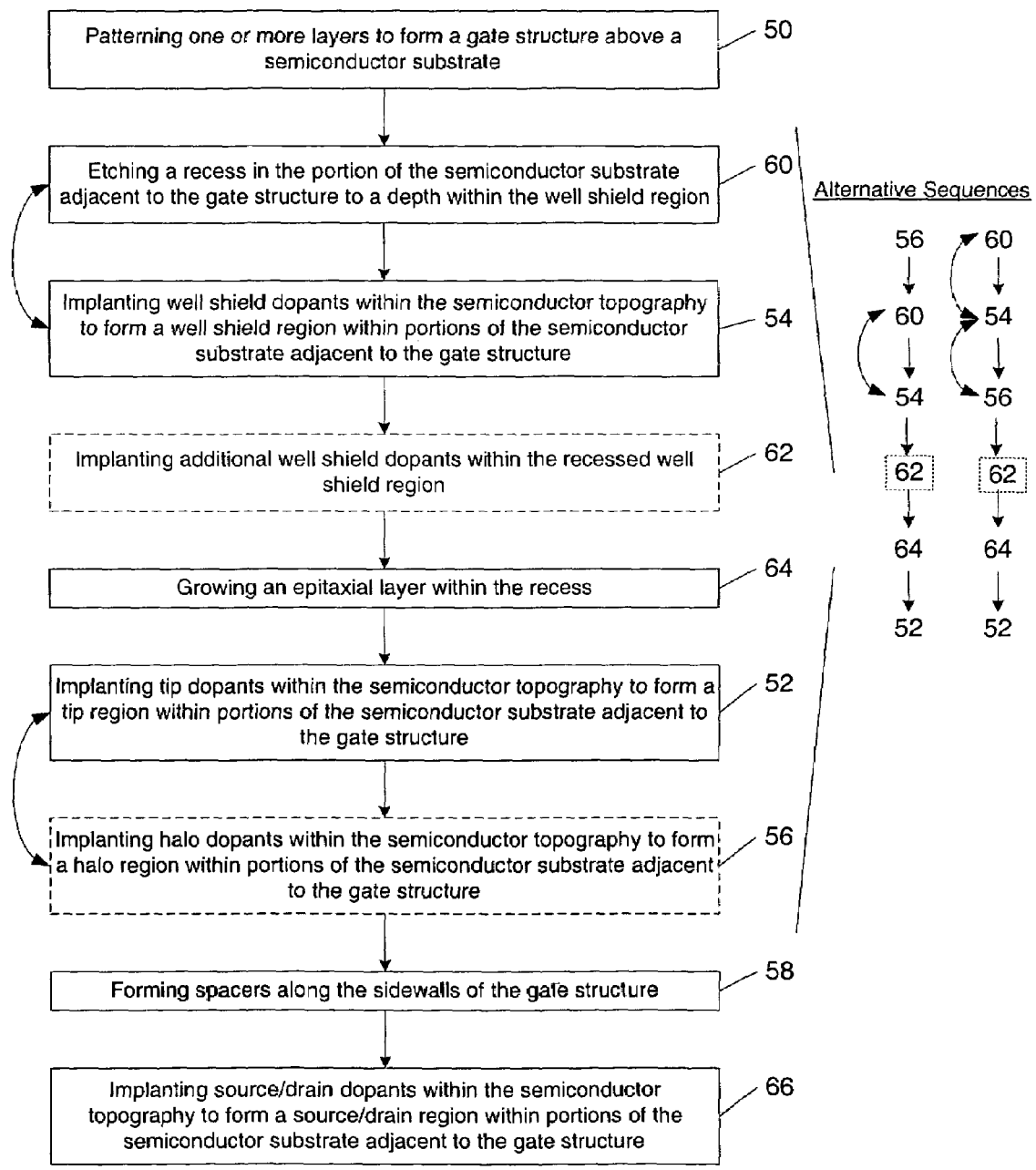
FIG. 12 is a flowchart outlining yet another alternative sequence of the process steps described in reference to FIGS. 1–9.
Figure 13:
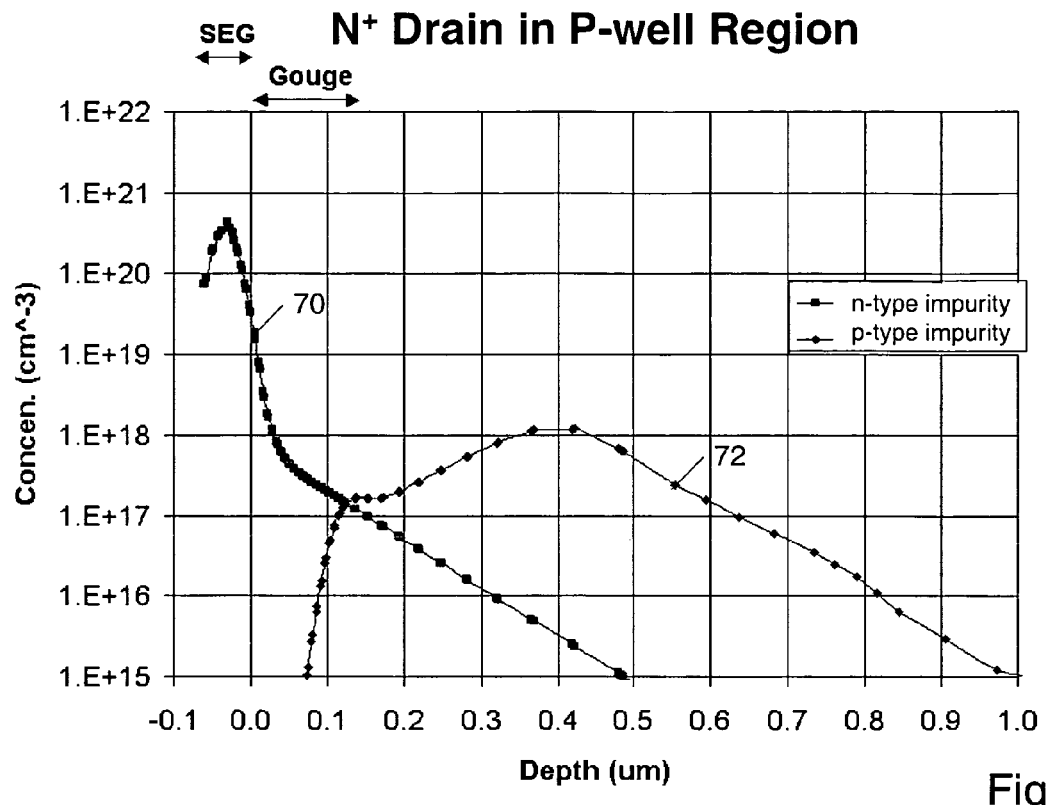
FIG. 13 is a graph of impurity concentrations within a drain node of a NMOS device formed according to an embodiment of the present invention.
Figure 14:
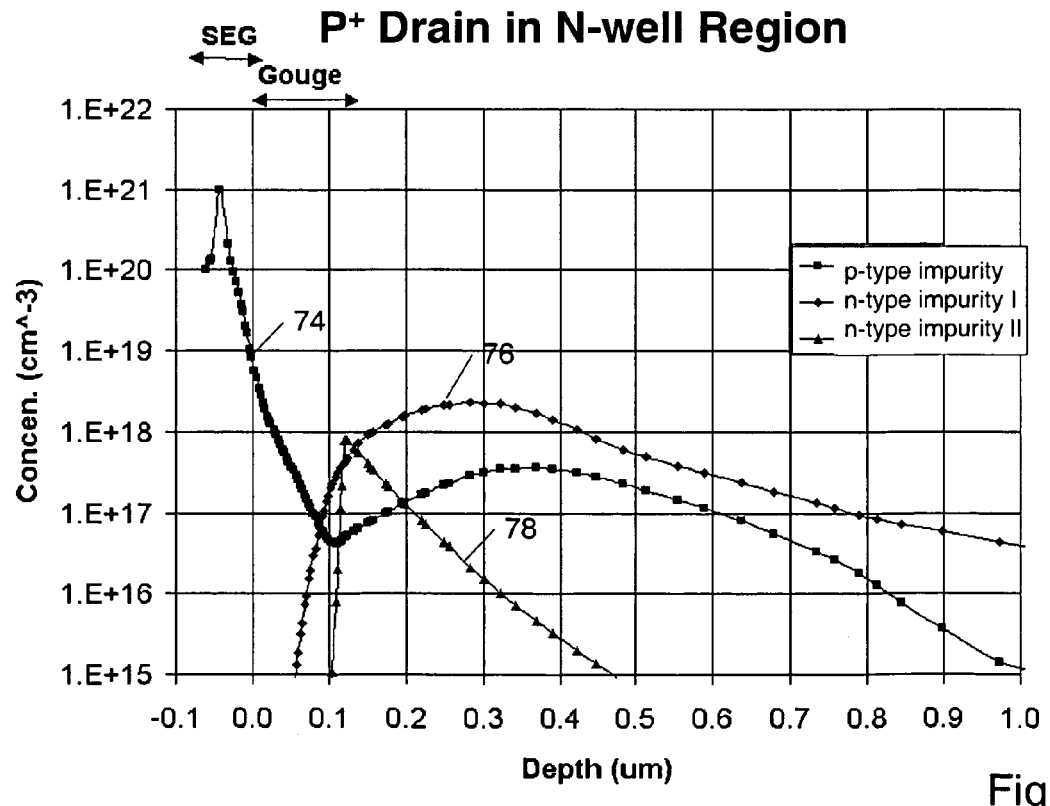
FIG. 14 is a graph of impurity concentrations within a drain node of a PMOS device formed according to an embodiment of the present invention.

Turning to the drawings, exemplary methods for forming MOS devices having diffusion regions with steep impurity profiles are provided. In particular, FIGS. 1–9 illustrate partial cross-sectional views of a semiconductor topography during different process steps which may be used to fabricate a MOS device with an exemplary well region having a steep impurity profile. FIGS. 10–12 show flowcharts of alternative sequences of the process steps depicted in FIGS. 1–9. In some embodiments, the methods described herein may additionally or alternatively be used to fabricate a MOS device with an exemplary halo region having a steep impurity profile, as illustrated through the partial cross-sectional views of the semiconductor topography depicted in FIGS. 19–23 and the flowchart of alternative process step sequences in FIG. 24. Exemplary concentration-depth profiles of diffusion regions formed within devices fabricated using such methods are depicted in FIGS. 13 and 14. In addition, simulated transient voltages and junction capacitance of drain nodes for devices fabricated using the methods are shown in FIGS. 15–18.

It is noted that the methods described herein may be used for the fabrication of PMOS devices, NMOS devices and/or a combination thereof (i.e., CMOS devices). As such, although the methods described herein are presented for forming diffusion regions adjacent to a single gate structure, the methods may be used to form diffusion regions adjacent to any number of gate structures. In addition, it is noted that the methods are particularly useful for, but are not limited to, the fabrication of Static Random Access Memory (SRAM) devices. Furthermore, as noted by the alternative process sequences presented in FIGS. 10–12 and 24, the methods are not necessarily restricted to the sequence of steps processing depicted in FIGS. 1–9 and 19–23. In particular, although FIGS. 1–9 and 19–23 illustrate exemplary sequences of steps for the methods described herein, other sequences may be employed. As such, FIGS. 1–9 and 19–23 are used to offer a pictorial explanation of the process steps, regardless of the sequence of steps utilized.

FIG. 1 illustrates a partial cross-sectional view of semiconductor topography 20 including dielectric layer 24 and conductive layer 26 formed above semiconductor substrate 22. As will be explained in more detail below in reference to FIG. 2, conductive layer 26 and, in some cases, dielectric layer 24 may be patterned to form a gate structure and, therefore, may include materials used in the microelectronic fabrication industry for such a structure. For example, conductive layer 26 may include any conductive material, such as doped amorphous silicon, doped polysilicon, aluminum, copper, titanium, tungsten, or any metal alloy, nitride or silicide thereof. In addition, dielectric layer 24 may include any dielectric material, such as silicon dioxide, silicon nitride, silicon oxynitride or silicon dioxide/silicon nitride/silicon dioxide (ONO). Alternatively, dielectric layer 24 may include metal oxides, such as aluminum oxide ($Al_2O_3$), titanium oxide ($TiO_2$), tantalum oxide ($Ta_2O_5$), hafnium oxide ($HfO_2$), and zirconium oxide ($ZrO_2$), or metal silicates. Other materials which may be known to those skilled in the art for gate structures may also be used for conductive layer 26 and dielectric layer 24.

Although FIG. 1 illustrates two layers formed upon semiconductor substrate 22, the methods described herein are not restricted to the formation of a gate structure with two layers. Consequently, in some embodiments, semiconductor topography 20 may include additional layers formed upon or in between conductive layer 26 and dielectric layer 24, such as but not limited to metal strapping layers and dielectric cap layers. The thicknesses of conductive layer 26 may generally be between approximately 300 angstroms and approximately 3000 angstroms. Dielectric layer 24 may generally include a thickness between approximately 15 angstroms and approximately 50 angstroms. Larger or smaller thicknesses of conductive layer 26 and dielectric layer 24, however, may be appropriate depending on the design specifications of the device.

In general, semiconductor substrate 22 may be a silicon substrate, which is doped either p-type or n-type or, alternatively, substantially undoped. In some embodiments, semiconductor substrate 22 may be a monocrystalline silicon substrate or a silicon-germanium substrate, such as SiGe or carbonated SiGe. Alternatively, semiconductor substrate 22 may include an epitaxial layer arranged upon an inter-level dielectric, forming a silicon-on-insulator (SOI) base on which structures and layers may be formed. As will be discussed in more detail below, FIGS. 1–12 are specifically described in regard to the formation of a well diffusion region for a NMOS or a PMOS device after patterning a gate structure for the device. As such, in some embodiments, semiconductor substrate 22 may not include a well diffusion region prior to the patterning of a gate structure from conductive layer 26 and dielectric layer 24.

In yet other embodiments, semiconductor substrate 22 may be fabricated with a well diffusion region prior to the patterning of a gate structure. For example, an epitaxial layer of a SOI substrate may be prefabricated with a well diffusion region. In other cases, a well region may be implanted into semiconductor substrate 22 prior to or subsequent to the formation of dielectric layer 24 and/or conductive layer 26. As such, it is noted that although a well region is not specifically depicted as part of semiconductor substrate 22 in FIGS. 1–9, the methods described in reference thereto may be applied to a substrate including a well region. In particular, the methods described herein may be used to fabricate a device with a well of opposite conductivity type than which may be included within the substrate. Alternatively, the methods may be used to increase the dose and/or concentration gradient of a well region already formed within the semiconductor substrate. An exemplary sequence of steps describing the latter of such embodiments is described in reference to FIGS. 19–24 along with steps for forming a halo region with a steep impurity profile.

In any case, semiconductor substrate 22 may, in some embodiments, include diffusion regions which are not well diffusion regions, such as buried layers for example. In addition, semiconductor substrate 22 may include isolation regions. Isolation regions and supplemental diffusion regions are not shown in FIGS. 1–12 and FIGS. 19–23 to simplify the drawings and, therefore, should not be presumed to be necessarily omitted. As noted above, the steps for forming a well region with a steep profile are depicted pictorially in FIGS. 1–9 and several sequences of such steps are depicted in flowcharts illustrated in FIGS. 10–12. The sequence of blocks depicted in FIG. 10 follow the succession of steps as presented in FIGS. 1–9 and, therefore, FIG. 10 is discussed in conjunction with FIGS. 1–9. FIGS. 11 and 12 are discussed after each of the steps are described to present yet further alternative manners in which to fabricate well regions with steep impurity profiles.

Figure 2:
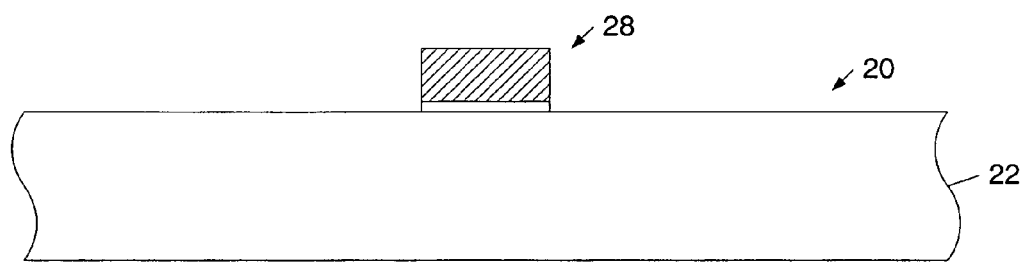
FIG. 2 is a partial cross-sectional view of the semiconductor topography of FIG. 1 subsequent to the patterning of the dielectric layer and the conductive layer into a gate structure.
Figure 3:
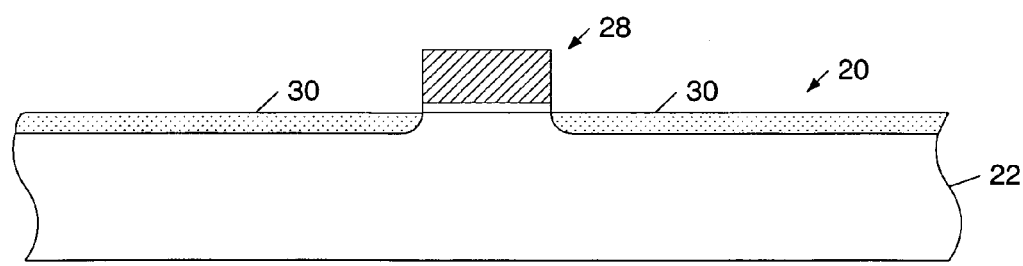
FIG. 3 is a partial cross-sectional view of the semiconductor topography in which tip regions are formed within the semiconductor substrate subsequent to the patterning of the gate structure in FIG. 2.

As shown in FIG. 2, conductive layer 26 and dielectric layer 24 may be patterned to form gate structure 28. Such a process is depicted in FIG. 10 as block 50. In some cases, dielectric layer 24 may not be patterned with conductive layer 26 to protect the surface of semiconductor substrate 22 during further processing. In either case, the patterning process may involve photolithography and etch techniques known in the semiconductor processing industry for the fabrication of gate structures. Continuing to FIG. 3, tip dopants may be implanted into semiconductor topography 20 to form tip regions 30 in portions of semiconductor substrate 22 adjacent to gate structure 28. The formation of tip regions 30 is additionally depicted in FIG. 10 as block 52.

In general, tip regions 30 may be formed to a shallow depth with a low concentration of impurities relative to source and drain regions subsequently formed adjacent to gate structure 28 as described below in reference to FIG. 9. Consequently, tip regions 30 may sometimes be referred to as lightly doped regions. In particular, tip implants may be implanted at a dose between approximately $5\times10^{12}$ ions/cm$^2$ and approximately $1\times10^{15}$ ions/cm$^2$ and at an energy between approximately 1 keV and approximately 60 keV to form tip regions 30 to a depth less than approximately 0.25 microns and at a concentration between approximately $1\times10^{17}$ ions/cm$^3$ and approximately $1\times10^{20}$ ions/cm$^3$. Larger or smaller doses, energies, depths and concentrations may be used and fabricated, however, depending on the impurity implanted and the design specifications of the device. The impurities used to form tip regions 30 may be n-type or p-type, depending on the device being formed (i.e., n-type impurities for NMOS devices and p-type impurities for PMOS devices).

Figure 4:
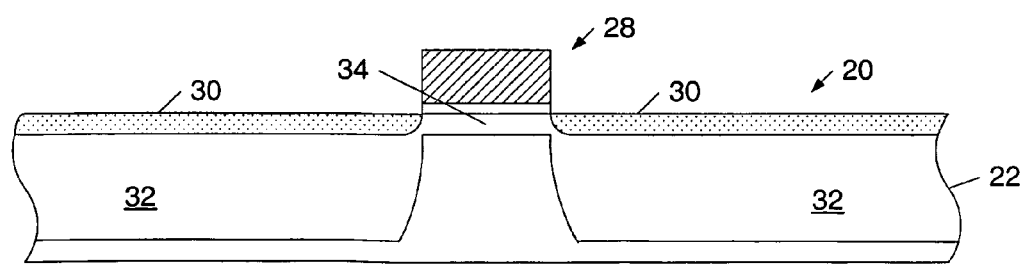
FIG. 4 is a partial cross-sectional view of the semiconductor topography in which well regions are formed within the semiconductor substrate subsequent to the formation of the tip regions in FIG. 3.

Turning to FIG. 4, well regions 32 may be formed into portions of semiconductor substrate 22 adjacent to gate structure 28 by implanting well dopants within semiconductor topography 20. The well dopants are of opposite conductivity type than the tip implants (i.e., p-type impurities for NMOS devices and n-type impurities for PMOS devices). Such a process is depicted in FIG. 10 as block 54. As noted above, FIGS. 1–12 are specifically described in regard to the formation of a well region subsequent to the patterning of a gate structure. Relative to well regions formed prior to the patterning of gate structure 28, well regions 32 may be formed at a higher concentration (i.e., using a higher dose of implants). In particular, the dosage level of implants used to form well regions prior to the patterning of a gate structure is limited by the impurity concentration of the channel region. The implantation of well dopants for the method described herein, however, is not so limited since channel region 34 between tip implants 30 is substantially masked by gate structure 28.

In general, the well dopants may be implanted at a high enough energy to form well regions 32 to a depth between approximately 0.5 microns and approximately 2.0 microns and a concentration between approximately $2.0\times10^{13}$ cm$^{-3}$ and approximately $5.0\times10^{18}$ cm$^{-3}$, depending on the dopant used and the design specifications of the device. Wells with larger or smaller depths and/or concentrations, however, may be formed for the process described herein. Some exemplary implantations of well dopants for the formation of p-type well regions may include elemental boron implanted at a dose between approximately $1\times10^{12}$ ions/cm$^2$ and approximately $5\times10^{14}$ ions/cm$^2$ and at an energy between approximately 5 keV and approximately 150 keV; difluoroborane (BF$_2$) implanted at a dose between approximately $1\times10^{12}$ ions/cm$^2$ and approximately $5\times10^{14}$ ions/cm$^2$ and at an energy between approximately 25 keV and approximately 500 keV; and elemental indium at a dose between approximately $1\times10^{12}$ ions/cm$^2$ and approximately $1\times10^{14}$ ions/cm$^2$ and at an energy between approximately 25 keV and approximately 1000 keV.

In embodiments in which n-type well regions are desired, elemental phosphorus may be implanted at a dose between approximately $1\times10^{12}$ ions/cm$^2$ and approximately $5\times10^{14}$ ions/cm$^2$ and at an energy between approximately 10 keV and approximately 300 keV. In some embodiments, it may be advantageous to implant phosphorus due to its relative deep implanted depth. Alternatively, arsenic may be implanted at a dose between approximately $1\times10^{12}$ ions/cm$^2$ and approximately $5\times10^{14}$ ions/cm$^2$ and at an energy between approximately 20 keV and approximately 1000 keV or elemental antimony may be implanted at a dose between approximately $1\times10^{12}$ ions/cm$^2$ and approximately $5\times10^{14}$ ions/cm$^2$ and at an energy between approximately 20 keV and approximately 1000 keV. Larger or smaller doses and energies may be used, however, depending on the design specifications of the device. Regardless of the type of MOS device formed, well regions 32 may be formed by a single implantation of well dopants in some cases. In other embodiments, however, the introduction of well dopants may include a series of implants.

As shown in FIG. 4, the implantation of well dopants may, in some embodiments, be sufficient to penetrate gate structure 28 to dope channel region 34. Such an application may be desirable in embodiments in which semiconductor substrate 22 is of same conductivity type as tip regions 30. In addition, doping channel region 34 may help to reduce punchthrough current and short channel effects of the ensuing transistor. Regardless of the conductivity type of semiconductor substrate 22 relative to tip regions 30, the well dopants may generally include an implant at a high enough energy to form channel region 34 with a peak concentration between approximately $2.0\times10^{16}$ cm$^{-3}$ and approximately $2.0\times10^{18}$ cm$^{-3}$ and a depth between approximately 0.05 microns and approximately 0.25 microns. However, channel dopant regions of larger or smaller depths and concentrations may be formed depending on the design specifications of the device.

In addition to serving as a well for a subsequently formed MOS device, well regions 32 may serve as a shield to inhibit ion strikes from flipping the state of a device during operation. In particular, since well regions 32 may be formed with a higher peak concentration than wells formed prior to the patterning of gate structure 28, well regions 32 may more effectively inhibit the collapse of the diffusion region in the well and, therefore, reduce the amount of funneling therethrough. As a result, the voltage perturbation on the drain node may be smaller and shorter, recovery from a voltage perturbation may be faster and feedback within the device be may be reduced. As such, the well dopants used to create well regions 32 may sometimes be referred to herein as "well shield dopants." In turn, well regions 32 may be referred to herein as "well shield regions".

Figure 5:
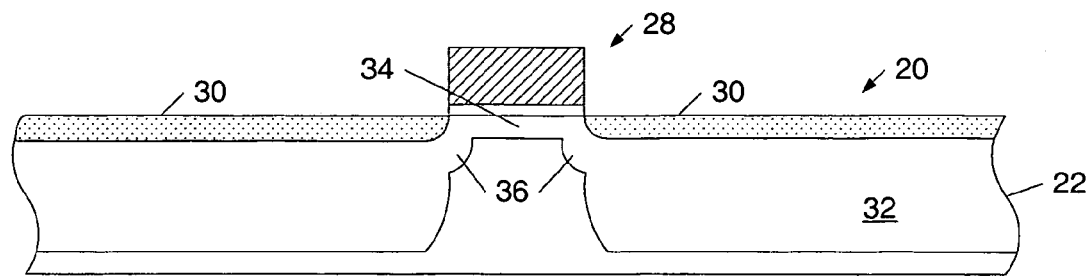
FIG. 5 is a partial cross-sectional view of the semiconductor topography in which halo regions are formed within the semiconductor substrate subsequent to the formation of the well regions in FIG. 4.

In some embodiments, halo regions 36 may be formed subsequent to the formation of well regions 32 as illustrated in FIG. 5 and as additionally noted in block 56 of FIG. 10. As shown in FIG. 5, halo regions 36 decrease the length of channel region 34, which may be advantageous for minimizing punchthrough current and short channel effects particularly in PMOS devices, thereby improving transistor performance. In general, halo regions 36 may be of the same conductivity type as the well dopants used to form well regions 32. In addition, halo regions 36 may be formed to a depth between tip regions 30 and well regions 32, such as between approximately 0.03 microns and approximately 1.0 micron. As shown in FIG. 5, halo regions 36 may extend under portions of gate structure 28. Such an extension may be formed by implanting the dopants at an angle between approximately 20° and approximately 30° relative the surface of semiconductor substrate 22. In other embodiments, the halo implants may be implanted perpendicular to semiconductor substrate 22. In either case, the halo implants may be implanted at a dose between approximately $1\times10^{12}$ ions/cm$^2$ and approximately $5\times10^{15}$ ions/cm$^2$ and at an energy between approximately 5 keV and approximately 150 keV to form halo regions 36 with a concentration between approximately $1\times10^{17}$ ions/cm$^3$ and approximately $1\times10^{18}$ ions/cm$^3$. Larger or smaller doses, energies, depths and concentrations may be used and fabricated, however, depending on the impurity implanted and the design specifications of the device.

Block 56 in FIG. 10 is outlined with a dotted line indicating the step is optional and, therefore, block 56 and the formation of halo regions described in reference to FIG. 5 may be omitted in some cases. FIG. 10 also illustrates alternative sequences of steps 52, 54 and 56 on the right hand side of the flowchart, indicating the order in which the tip, well and halo regions are formed may differ. In particular, FIG. 10 illustrates that halo regions may be formed prior to well regions and/or tip regions. Moreover, FIG. 10 shows that well regions may be formed prior to tip regions and/or subsequent to halo regions. Reference number 56 is outlined by a dotted line in each of the alternative sequences to indicate that the formation of halo regions is optional. Regardless of the order in which the diffusion regions are formed, the doses and energies used to form the regions may be regulated to produce the appropriate conductivity type within the regions. In particular, the tip, well and/or halo regions may be formed at a sufficient dose such that the majority concentration of impurities in the tip and/or halo regions is of opposite conductivity than the majority concentration of impurities in the well regions.

Figure 6:
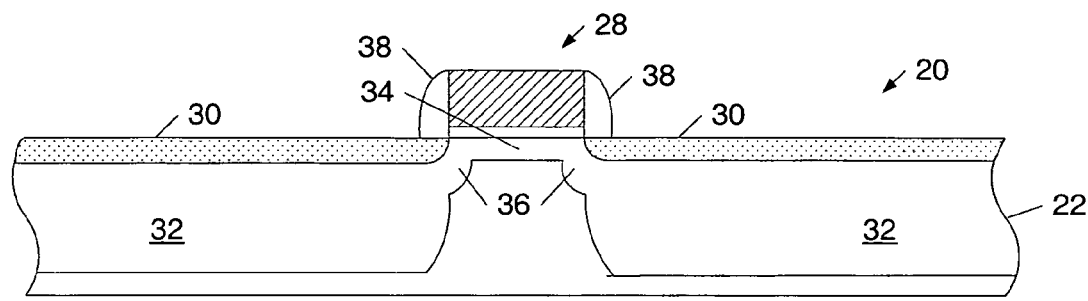
FIG. 6 is a partial cross-sectional view of the semiconductor topography in which sidewall spacers are formed along the sidewalls of the gate structure subsequent to the formation of the halo regions in FIG. 5.
Figure 7:
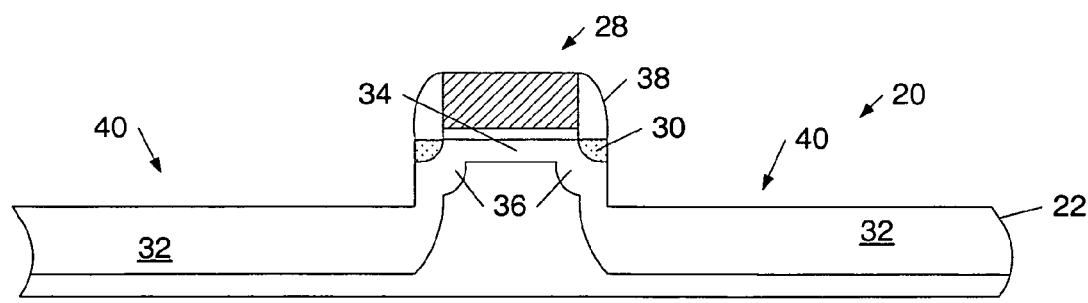
FIG. 7 is a partial cross-sectional view of the semiconductor topography in which recesses are formed within the semiconductor substrate subsequent to the formation of the sidewall spacers in FIG. 6.

Turning to FIG. 6, sidewall spacers 38 may be formed along the sidewalls of gate structure 28. Such a process is depicted as block 58 in FIG. 10. In general, sidewall spacers 38 may be formed by depositing a dielectric material over gate structure 28 and adjacent portions of semiconductor substrate 22. Subsequently, the deposited layer may be aniostropically etched to form sidewall spacers 38 along the sidewalls of gate structure 28. In general, sidewall spacers 38 may include a dielectric material, such as silicon dioxide, silicon nitride or silicon oxynitride, for example. As shown in FIG. 7 and noted in block 60 of FIG. 10, recesses 40 may be etched in alignment with sidewall spacers 38. In general, the formation of recesses 40 may include wet or dry etch techniques using photolithography processes or chemistries which are particularly selective to silicon. In general, recesses 40 may be etched within well region 32 and, more preferably, to a depth near the peak concentration of well region 32. The peak concentration of well region 32 may be estimated by measurements taken of topographies having well regions formed using similar doses and energies of impurities. In some embodiments, recesses 40 may be etched to a depth between approximately 100 angstroms and approximately 2000 angstroms below the upper surface of semiconductor substrate 22. Larger or smaller depths for recesses 40, however, may be formed, depending on the design specifications of the device.

As shown in FIG. 10, the method may, in some embodiments, include block 62 in which additional dopants may be implanted within the recess regions of the semiconductor substrate. In particular, the method may include implanting additional well dopants into semiconductor substrate 22 subsequent to the formation of recess 40 and prior to the growth of epitaxial layer 42, which is described in more detail below in reference to FIG. 8. In some cases, the additional dopants may be additional well dopants of the same conductivity type as the well dopants used to form well regions 32 prior to the formation of recess 40. Such an additional implantation may advantageously increase the concentration of impurities of such a conductivity type within the well region (i.e., increasing the net concentration of electrically active impurities), providing a stronger shield to funneling electron-hole pairs during operations of the ensuing transistor and, thus, improving the SER of the device. In addition, the additional implantation may advantageously allow well regions having a higher concentration of impurities to be formed, reducing SEL occurrences and negating the limitations imposed for the formation of the tip, halo and channel regions of the device during previous fabrication steps.

In other embodiments, the additional dopants may be halo dopants of the opposite conductivity type as the well dopants used to form well regions 32 prior to the formation of recess 40. In such embodiments, the implantation of the additional dopants is preferably configured to increase the concentration of remaining portions of halo regions 36 without significantly reducing the net concentration of electrically active impurities within well regions 32. It is noted that block 62 may include the implantation of either or both well dopants or halo dopants. In any of such cases, the implantation of additional dopants may be referred to as implanting dopants within portions of the semiconductor substrate bordering the recess. As noted in FIG. 10, block 62 is outlined by a dotted line indicating the step is optional. Consequently, block 62 may be omitted in some cases. Omitting block 62 may be advantageous, in some embodiments, for minimizing the number of process steps in the fabrication sequence, reducing costs and process time.

Figure 8:
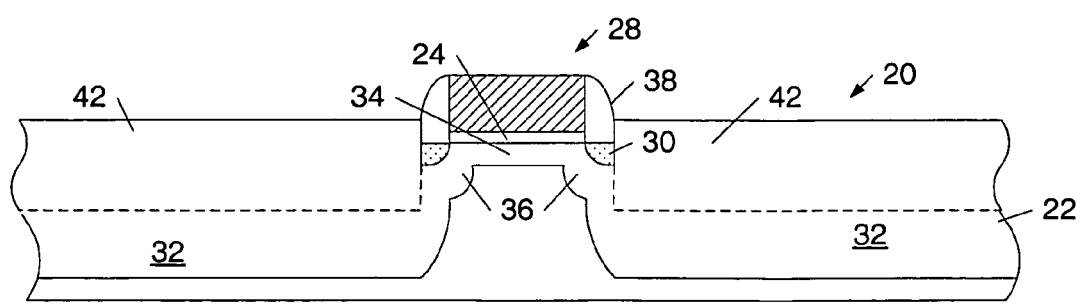
FIG. 8 is a partial cross-sectional view of the semiconductor topography in which an epitaxial layer is formed upon the semiconductor substrate subsequent to the formation of the recesses in FIG. 7.

Subsequent to the formation of recesses 40, semiconductor topography 20 may be exposed to a selective epitaxial growth (SEG) process to form epitaxial layer 42 within recesses 40 as shown in FIG. 8 and noted in block 64 in FIG. 10. In particular, semiconductor topography 20 may be exposed to a silicon source, such as silane, dichlorosilane, trichlorosilane or tetrachlorosilane, at a temperature between approximately 500° C. and approximately 1000° C. to grow epitaxial layer 42 upon exposed portions of semiconductor substrate 22 without forming a silicon layer upon exposed portions of gate structure 28. A dotted line is shown in FIG. 8 depicting the interface between semiconductor substrate 22 and epitaxial layer 42. In some embodiments, semiconductor topography 20 may be exposed to one or more impurities during the SEG process such that epitaxial layer 42 may be formed as n-type or p-type. In other embodiments, epitaxial layer 42 may not be doped during the SEG process. In such cases, epitaxial layer 42 may, in some embodiments, be subsequently doped by an implantation of impurities. In other embodiments, epitaxial layer 42 may not be doped.

As shown in FIG. 8, epitaxial layer 42 may, in some embodiments, be grown to an elevation higher than the upper surface of semiconductor substrate 22 arranged below gate structure 28 and, in some cases, higher than the upper surface of gate dielectric 24. For example, epitaxial layer 42 may, in some cases, be formed to an elevation up to approximately 1000 angstroms higher than gate dielectric 24. Growing epitaxial layer 42 to an elevation above the upper surface of semiconductor substrate 22 may advantageously reduce the depth and, therefore, the aspect ratio of contact openings subsequently formed to expose the source and drain regions of the ensuing transistor. Contact openings with reduced aspect ratios facilitate better fill conditions, inhibiting the formation of voids within contacts formed therein, consequently reducing the resistance of the contacts. In alternative embodiments, epitaxial layer 42 may be formed to an elevation coplanar or lower than the upper surface of semiconductor substrate 22.

Figure 9:
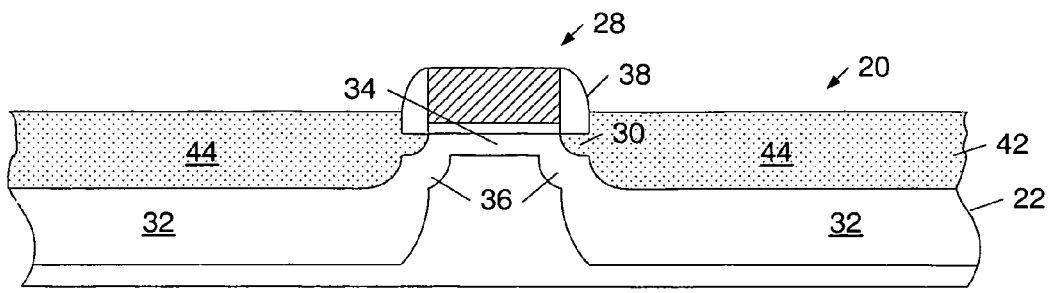
FIG. 9 is a partial cross-sectional view of the semiconductor topography in which source and drain regions are formed within the semiconductor substrate subsequent to the formation of the epitaxial layer in FIG. 8.

FIG. 9 illustrates the formation of source and drain regions 44 within semiconductor substrate 22 adjacent to gate structure 28. Such a process is depicted in FIG. 10 as block 66. The source and drain dopants used to form source and drain regions 44 are of the same conductivity type as the tip dopants used to form tip regions 30 (i.e., n-type impurities for NMOS devices and p-type impurities for PMOS devices). In general, the source and drain dopants may include an implant at a high enough energy to form source and drain regions 44 to a depth between approximately 0.5 microns and approximately 1.0 micron and a concentration between approximately $2.0 \times 10^{13}$ cm$^{-3}$ and approximately $5.0 \times 10^{18}$ cm$^{-3}$, depending on the dopant used and the design specifications of the device. Exemplary doses and energies used to fabricate such depths and concentrations may include doses between approximately $1 \times 10^{12}$ ions/cm$^2$ and approximately $5 \times 10.5$ ions/cm$^2$ at an energy between approximately 5 keV and approximately 150 keV.

For example, in embodiments in which the ensuing device is a NMOS device, the formation of source and drain regions 44 may include an implant of arsenic at a dose between approximately $1 \times 10^{15}$ ions/cm$^2$ and approximately $5 \times 10^{15}$ ions/cm$^2$ at an energy from about 10 keV to about 60 keV. In embodiments when the ensuing device is a PMOS device, the formation of source and drain regions 44 may include an implant of difluoroborane at a dose of from about $1 \times 10^{15}$ ions/cm$^2$ and approximately $5 \times 10^{15}$ ions/cm$^2$ at an energy from about 5 keV to about 30 keV. Larger or smaller doses, energies, depths and/or concentrations and different impurities, however, may be employed for the process described herein. In addition, source and drain regions 44 may be formed by a single implantation of source and drain dopants or a series of implants. Because the source and drain dopants are implanted at a relatively low energy, a source and drain junction forms between source and drain regions 44 and well regions 32 within epitaxial layer 42, minimizing junction capacitance (Cj) degradation.

Subsequent to the formation of source and drain regions 44, semiconductor topography 20 may be annealed to activate the implanted impurities and eliminate defects created by the previous dopant implantations. In some embodiments, the anneal process may be a rapid thermal anneal process. In particular, semiconductor topography 20 may be exposed to a relatively high temperature, such as between approximately 600° C. and approximately 1100° C., for less than a minute and, more preferably for approximately 20 seconds or less. In other embodiments, the anneal process may be a flash anneal, furnace anneal, or a laser anneal.

Turning to FIG. 11, an alternative sequence of the steps described relative to FIGS. 1–9 are outlined in a flowchart to offer another manner in which to fabricate a well region with a steep profile. The sequences of steps illustrated in FIG. 11 differ from the sequences illustrated in FIG. 10 in that the well region is formed subsequent to the formation of the sidewall spacers and, in some cases, subsequent to the formation of the recesses. As shown in FIG. 11, a method is presented that includes step 50 in which one or more layers are patterned to form a gate structure above a semiconductor substrate. Such a process is described above in reference to FIG. 2. The method further includes the formation of tip regions and halo regions within portions of the semiconductor substrate adjacent to the gate structure as noted in blocks 52 and 56, respectively, in FIG. 11. Details of the formation of such regions are described above in reference to FIGS. 3 and 5. As shown in FIG. 11, block 56 is outlined by a dotted line indicating the formation of halo regions is optional. FIG. 11 further includes a dual-arrow link connecting block 52 and 56, indicating the steps may be reversed in some embodiments. Subsequent to the formation of the tip regions, spacers may be formed along the sidewalls of the gate structure as shown in block 58. Such a process is described above in reference to FIG. 6.

Thereafter, well dopants may be implanted into the semiconductor topography to form well regions within portions of the semiconductor topography spaced adjacent to the gate structure (i.e., spaced adjacent to the gate structure by the width of the sidewall spacers) as noted in block 54 in FIG. 11. The implantation of well dopants is described above in reference to FIG. 4. The method may continue with the sequence of etching recesses within the semiconductor substrate in alignment with the sidewall spacers, optionally implanting additional well dopants and growing an epitaxial layer as noted respectively in blocks 60, 62 and 64. Details of such processes are discussed above in reference to FIGS. 7 and 8. In alternative sequences, the well regions may be formed subsequent to the formation of the recesses and prior to the growth of the epitaxial layer as noted to the right hand side of the flowchart depicted in FIG. 11. In such embodiments, the implantation of the well dopants may be referred to as implanting dopants within portions of the semiconductor substrate bordering the recess. In either case, the method may include the implantation of source and drain dopants into the epitaxial layer to form source and drain regions within portions of the semiconductor substrate adjacent to the gate structure as noted in block 66 in FIG. 11. Subsequent to the formation of the source and drain regions, the semiconductor topography may be annealed to activate the implanted impurities and eliminate defects created by the previous dopant implantations. The implantation of the source and drain dopants and the subsequent anneal process is described above in reference to FIG. 9.

FIG. 12 illustrates yet another flowchart depicting alternative sequences of the steps described in reference to FIGS. 1–9 for the formation of a well region with a steep concentration profile. The sequences of steps illustrated in FIG. 12 differ from the sequences illustrated in FIGS. 10 and 11 in that the recesses, well regions, and epitaxial layer are formed prior to the formation of the tip and halo regions. As shown in FIG. 12, the method includes step 50 in which one or more layers are patterned to form a gate structure above a semiconductor substrate, such as described above in reference to FIG. 2. The method well further includes the formation of a recess and the implantation of well dopants into the portions of the semiconductor topography adjacent to the gate structure as noted in blocks 60 and 54, respectively, in FIG. 12. The formation of the recess is described above in reference to FIG. 7 and the implantation of well dopants is described above in reference to FIG. 4. FIG. 12 includes a dual-arrow link connecting blocks 60 and 54, indicating the steps may be reversed in some embodiments. In either case, the method may continue with the sequence of optionally implanting additional well dopants and growing an epitaxial layer as noted respectively in blocks 62 and 64. Details of such processes are discussed above in reference to FIGS. 7 and 8.

Subsequent to the growth of the epitaxial layer, the method may include the formation of tip regions and, in some cases, halo regions within portions of the semiconductor substrate adjacent to the gate structure as noted in blocks 52 and 56, respectively, in FIG. 12. As shown in FIG. 12, block 56 is outlined by a dotted line indicating the formation of halo regions is optional. FIG. 12 further includes a dual-arrow link between block 52 and 56, indicating the steps may be reversed in some embodiments. In yet other embodiments, halo regions may be formed prior to the formation of the recesses and implantation of well dopants as noted in one of the alternative sequence of steps to the right of the flowchart illustrated in FIG. 12 (i.e., alternative sequence: 56-60-54-62-62-52). In such embodiments, the implantation of the halo dopants may be referred to as implanting dopants within portions of the semiconductor substrate bordering the recess. Alternatively, halo reigons may be formed subsequent to the formation of the recesses and/or implantation of well dopants, but prior to the growth of the epitaxial layer (i.e., alternative sequence: 60-54-56-62-64-52). References numbers 60 and 54 and reference numbers 54 and 56 are connected by dual-arrowed links indicating the processes may be respectively reversed.

Subsequent to the formation of the tip regions, spacers may be formed along the sidewalls of the gate structure as shown in block 58. Such a process is described above in reference to FIG. 6. In alignment with such sidewall spacers, the source and drain dopants may be implanted into the epitaxial layer to form source and drain regions within portions of the semiconductor substrate adjacent to the gate structure as noted in block 66 in FIG. 12. Subsequent to the formation of the source and drain regions, the semiconductor topography may be annealed to activate the implanted impurities and eliminate defects created by the previous dopant implantations. The implantation of the source and drain dopants and the subsequent anneal process is described above in reference to FIG. 9.

FIGS. 13 and 14 illustrate profiles of impurity concentrations within drain regions of exemplary NMOS and PMOS devices, respectively, formed using the methods described above in reference to FIGS. 1–12. In particular, FIG. 13 illustrates a profile of impurity concentration as a function of depth within a drain region of an exemplary NMOS device fabricated using the methods described above in reference to FIGS. 1–12. Conversely, FIG. 14 illustrates a profile of impurity concentrations as a function of depth within a drain region of an exemplary PMOS device fabricated using the methods described above in reference to FIGS. 1–12. For the NMOS device graphed in FIG. 13, the well shield formation parameters included the implantation of approximately $2.0 \times 10^{13}$ ions/cm$^2$ of elemental boron at approximately 140 keV; the recess was formed to a depth of approximately 1200 angstroms; and the final raised height of the epitaxial layer was approximately 600 angstroms above the upper surface of the semiconductor substrate. For the PMOS device graphed in FIG. 14, the well shield formation parameters included the implantation of approximately $5.0 \times 10^{13}$ ions/cm$^2$ of elemental phosphorus at approximately 200 keV; the recess was formed to a depth of approximately 1200 angstroms; and the final raised height of the epitaxial layer was approximately 600 angstroms above the upper surface of the semiconductor substrate.

As shown in both FIGS. 13 and 14, the depth of the concentration profile relative to the upper surface of the semiconductor substrate upon which the gate of the transistor is formed extends from approximately −0.06 microns to beyond 1.0 micron. The negative depth refers to growth of the epitaxial layer above the upper surface of the semiconductor substrate and is labeled at the top of the graph as the "SEG" region. The portion of the concentration profile extending below the SEG region at a depth of 0.0 microns (i.e., corresponding to the upper surface of the semiconductor substrate) to approximately 0.12 microns is referenced at the top of the graph as the "Gouge" region and refers to the portion of the substrate which was etched to form the recess during the fabrication of the exemplary device. As noted above, the depth of the recesses may vary depending on the design specifications of the device and, therefore, the methods described herein are not necessarily restricted to recess depths of 0.12 microns.

As shown in FIG. 13, the drain region may include an upper portion consisting essentially of n-type impurities as denoted by line 70 with the square plot points in the depth region between approximately −0.06 microns and approximately 0.08 microns. The drain region further includes a lower boundary comprising substantially equal concentrations of n-type impurities and p-type impurities as shown by the intersection of line 70 of the square plot points and line 72 of the diamond plot points (denoting the concentration of the p-type impurities) at approximately 0.12 microns. The inclusion of the p-type impurities at the lower portion of the n-type drain region is most likely due to the diffusion of p-type impurities from the well region during the anneal process used to activate the implanted impurities and eliminate defects created by the dopant implantations. The anneal process is generally configured to limit such diffusion and, therefore, a device may be fabricated with source and drain regions having impurities of a single conductivity type opposite to that of the well region at its upper surface using the methods described herein.

As shown in FIG. 13, the peak concentration of the p-type impurities may be greater than $1.0 \times 10^{18}$ cm$^{-3}$ for an exemplary device due to the methods described herein. Although the methods may be configured to produce larger or smaller peak concentrations, such a peak concentration may advantageously inhibit the funneling of electrons during ion strikes of the exemplary device described in reference to FIG. 13, improving soft error rates (SER) for the device as compared to devices having similar design specifications fabricated by conventional techniques. In addition, single event latch-up (SEL) occurrences may be reduced due to the relative high well region impurity concentration.

FIG. 14 illustrates a drain region of an exemplary PMOS device including an upper portion consisting essentially of p-type impurities as denoted by line 74 of the square plot points in the depth region between approximately −0.06 microns and approximately 0.06 microns. The drain region further includes a lower boundary comprising substantially equal concentrations of n-type impurities and p-type impurities as shown by the intersection of line 74 of the square plot points and line 76 of the diamond plot points (denoting the concentration of n-type impurity I) at approximately 0.09 microns. As with the inclusion of the p-type impurities at the lower portion of the n-type drain described in reference to FIG. 13, the inclusion of the n-type impurities at the lower portion of the p-type drain region is most likely due to the diffusion of n-type impurities from the well region during the anneal process used to activate the implanted impurities and eliminate defects created by the dopant implantations. As noted above, the anneal process is generally configured to limit such diffusion and, therefore, a device may be fabricated with source and drain regions having impurities of a single conductivity type at its upper surface using the methods described herein.

As shown in FIG. 14, the peak concentration of the n-type impurity I may be greater than $3.0 \times 10^{18}$ cm$^{-3}$ for an exemplary device due to the methods described herein. Although the methods may be configured to produce larger or smaller peak concentrations, such a peak concentration may advantageously inhibit the funneling of electrons during ion strikes of the exemplary device described in reference to FIG. 14, improving soft error rates (SER) for the device as compared to devices having similar design specifications fabricated by conventional techniques. In addition, single event latch-up (SEL) occurrences may be reduced due to the relative high well region impurity concentration. FIG. 14 further illustrates a concentration of a second type of n-type impurity (n-type impurity II) with line 78 of the triangle plot points at a depth between approximately 0.1 micron and approximately 0.47 microns. Such an impurity region refers to a halo region formed within the PMOS device.

Figure 15:
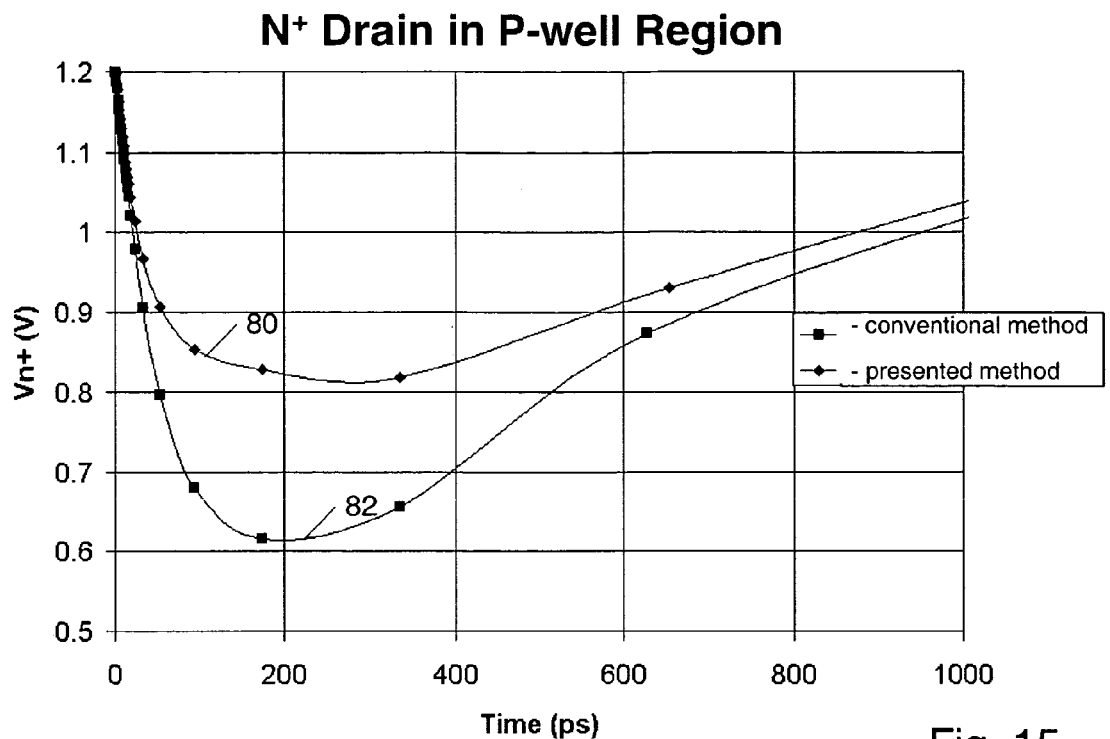
FIG. 15 is a graph of simulated transient voltages on a drain node of a NMOS device formed according to an embodiment of the present invention.
Figure 16:
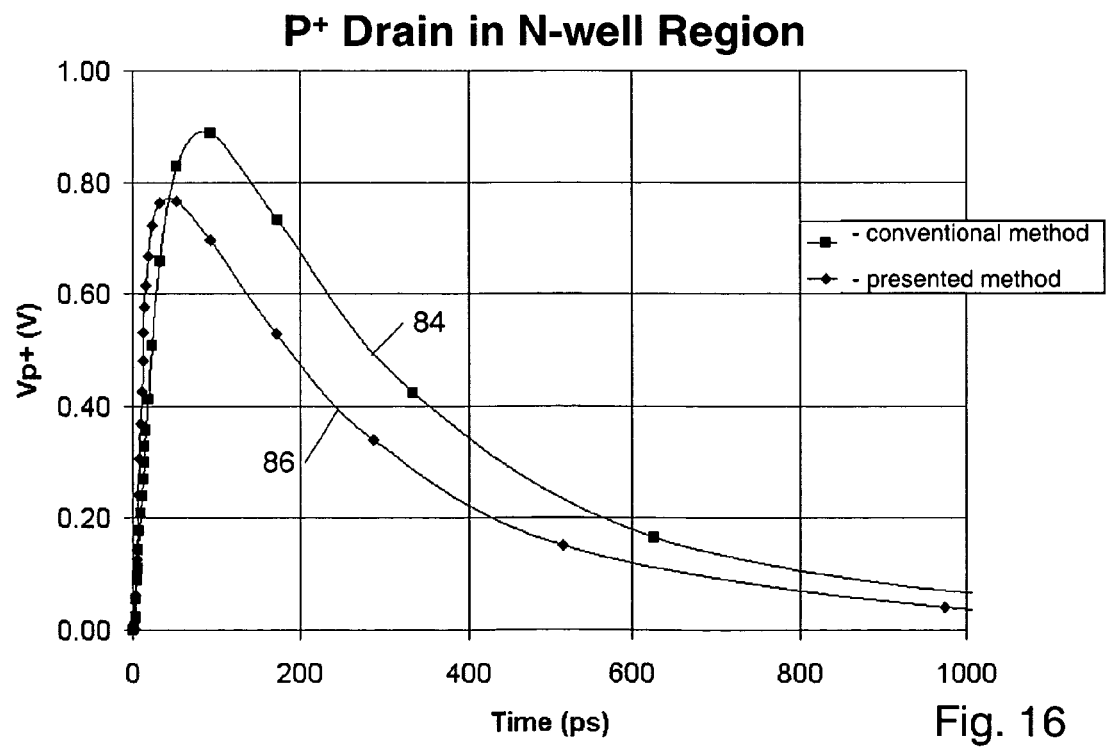
FIG. 16 is a graph of simulated transient voltages on a drain node of a PMOS device formed according to an embodiment of the present invention.

FIGS. 15 and 16 illustrate graphs of simulated transient voltages perturbed on drain regions of exemplary NMOS and PMOS devices, respectively, formed using the methods described above in reference to FIGS. 1–12. In particular, FIG. 15 illustrates simulated transient voltages as a function of time on a drain region of an exemplary NMOS device fabricated using the methods described above in reference to FIGS. 1–12. Conversely, FIG. 16 illustrates simulated transient voltages as a function of time on a drain region of an exemplary PMOS device fabricated using the methods described above in reference to FIGS. 1–12. As shown in FIGS. 15 and 16, transient voltages simulated on drain nodes of NMOS and PMOS devices fabricated using the methods described herein (respectively denoted by lines 80 and 86 with the diamond-shaped plot points) have lower amplitudes and shorter periods than transient voltages simulated on drain nodes of NMOS and PMOS devices fabricated from conventional methods (respectively denoted by lines 82 and 84 with the square-shaped plot points). In such a comparison, the devices fabricated by conventional methods are devices in which well regions are formed prior to the patterning of a gate structure. As noted above, smaller and shorter voltage perturbation on drain nodes and faster recovery therefrom may advantageously inhibit the funneling of electrons during ion strikes of the device, improving soft error rates (SER) within the device.

Figure 17:
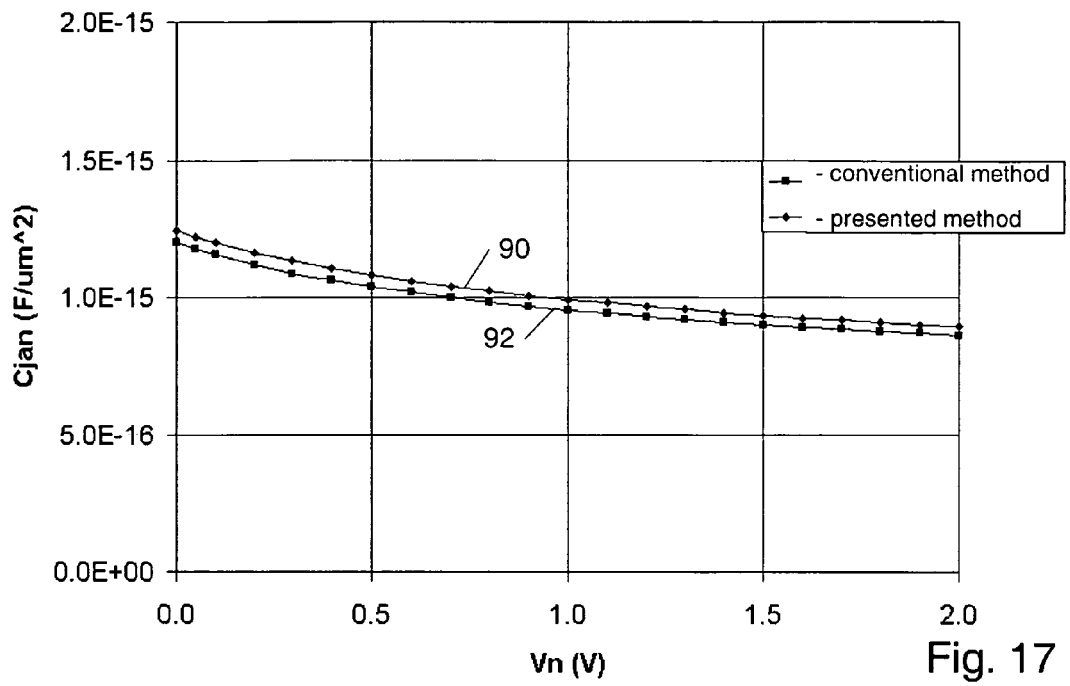
FIG. 17 is a graph of simulated junction capacitance for a NMOS device formed according to an embodiment of the present invention.
Figure 18:
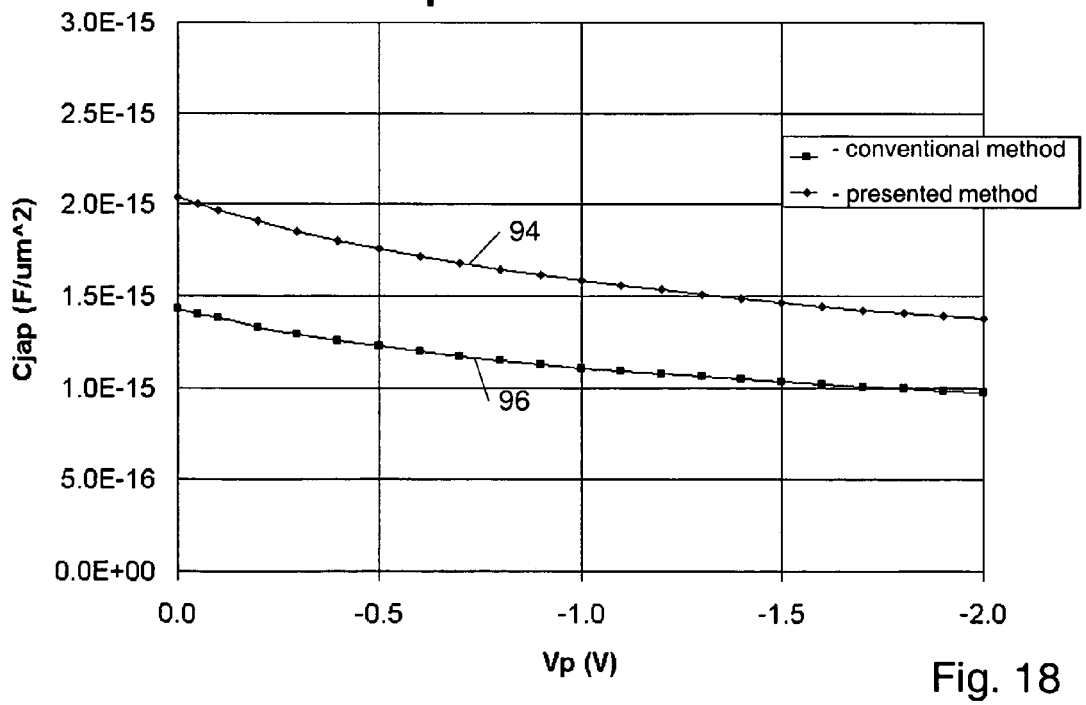
FIG. 18 is a graph of simulated junction capacitance for a PMOS device formed according to an embodiment of the present invention.

FIGS. 17 and 18 illustrate graphs of simulated junction capacitance for drain regions of exemplary NMOS and PMOS devices, respectively, formed using the methods described above in reference to FIGS. 1–12. In particular, FIG. 17 illustrates simulated junction capacitance (Cjan) as a function of applied voltages for a drain region of an exemplary NMOS device fabricated using the methods described above in reference to FIGS. 1–12. Conversely, FIG. 18 illustrates simulated junction capacitance (Cjap) as a function of applied voltages for a drain region of an exemplary PMOS device fabricated using the methods described above in reference to FIGS. 1–12. As shown in FIGS. 17 and 18, the devices fabricated using the methods described herein (respectively denoted by the lines 90 and 94 with the diamond-shaped plot points) are compared to devices fabricated using conventional methods (respectively denoted by lines 92 and 96 with the square-shaped plot points). In reference to FIGS. 17 and 18, conventional methods refer to processes in which well regions are formed prior to the patterning of a gate structure.

As shown in FIG. 17, the simulated junction capacitance for a drain region of a NMOS device fabricated using the methods described herein is only slightly higher than the simulated junction capacitance for a drain region of a NMOS device fabricated using conventional methods. Although FIG. 18 illustrates a slightly greater difference in junction capacitance for drain nodes of PMOS devices formed using the methods described herein and those fabricated using conventional methods, the difference is not considered significant. Such negligible increases in junction capacitance is generally due to the epitaxial layer being formed substantially undoped or lightly doped relative to the underlying well region. In particular, the source and drain dopants may be implanted with lower doses and energies, reducing the net concentration of impurities within the resulting source and drain regions relative to devices in which source and drain dopants are implanted within portions of well regions. As a consequence, junction capacitance degradation for a device fabricated using the methods described herein is minimized.

Figure 24:
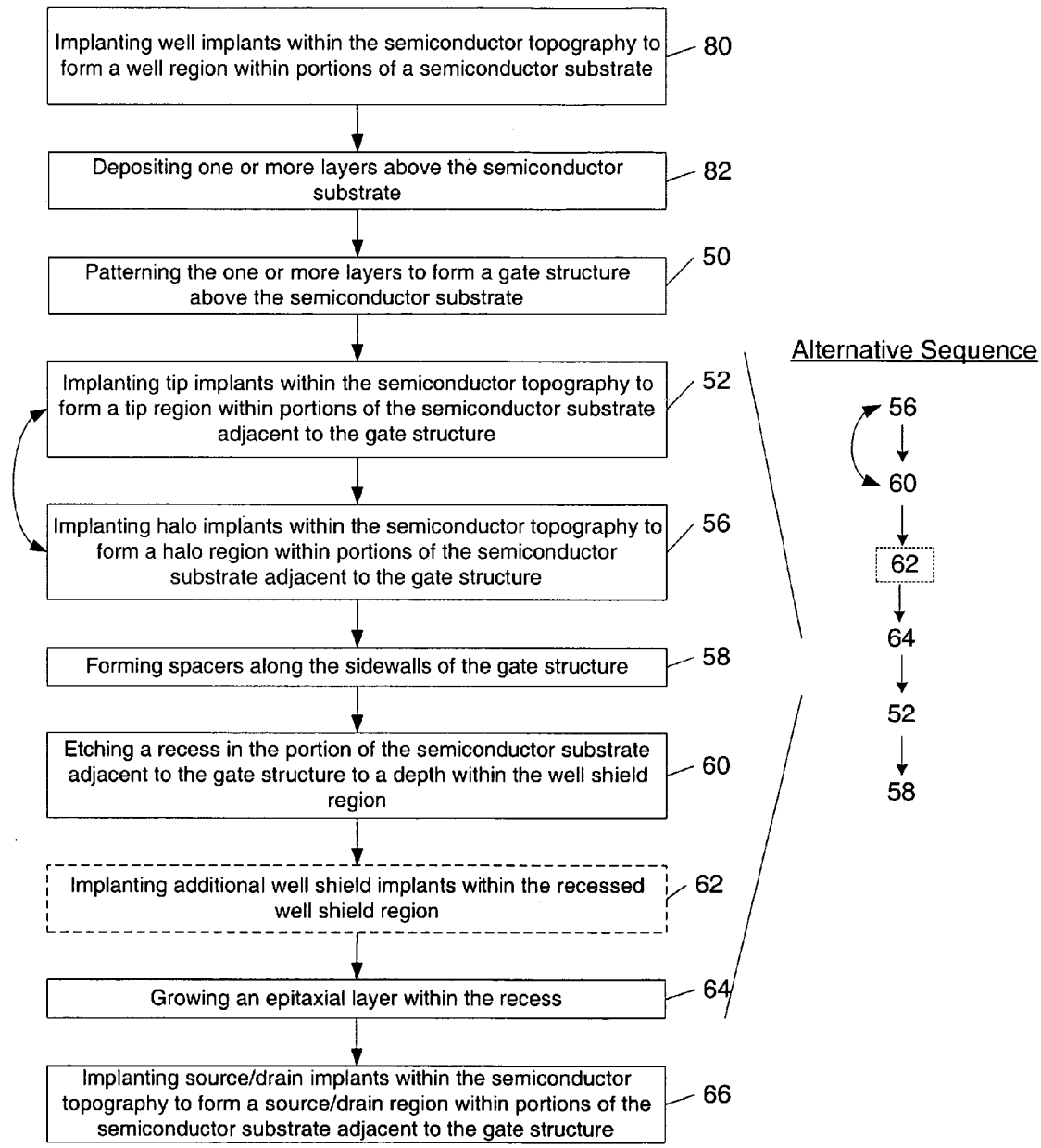
FIG. 24 is a flowchart outlining the sequence of process steps described in reference to FIGS. 19–23 as well as alternative sequences of such process steps.

As noted above, the processes described herein may additionally or alternatively be used to form a halo region with a steep concentration profile. Exemplary steps for forming a halo region with a steep profile are depicted pictorially in FIGS. 19–23 and several sequences of such steps are outlined in FIG. 24. The sequence of blocks depicted in FIG. 24 follow the succession of steps as presented in FIGS. 19–23 and, consequently, FIG. 24 is discussed in conjunction with FIGS. 19–23. Alternative sequences are also discussed conjunction thereto. As noted below, FIGS. 19–24 include some of the same references numbers used to describe semiconductor topography 20 in FIGS. 1–9 and the process steps included in FIGS. 10–12. It is noted that the layers, structures and process steps corresponding to such references numbers generally include the same characteristics (e.g., composition, thickness, function, process techniques, etc.) as those described in reference to FIGS. 1–12 and, therefore, their descriptions are not reiterated in detail for FIGS. 19–24. Rather, the description of the layers, structures and process steps corresponding to references numbers in FIGS. 1–12 are incorporated for the same reference numbers included in FIGS. 19–24.

Figure 19:
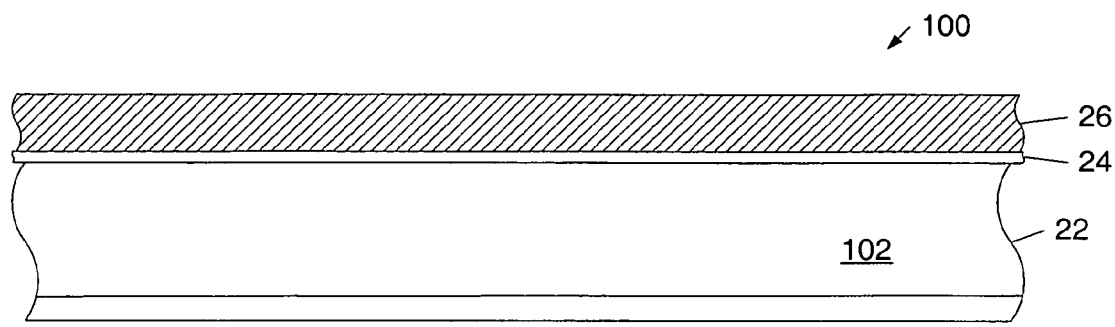
FIG. 19 is a partial cross-sectional view of a semiconductor topography in which a dielectric layer and a conductive layer have been formed upon a semiconductor substrate including a well region.

FIG. 19 illustrates a partial cross-sectional view of semiconductor topography 100 including dielectric layer 24 and conductive layer 26 formed above semiconductor substrate 22 having well region 102 formed therein. Semiconductor substrate 22, dielectric layer 24 and conductive layer 26 may include any of the characteristics, such as material composition and thicknesses, described above in regard to FIG. 1 for the layers having the same reference numbers in semiconductor topography 20. Semiconductor topography 100, however differs from semiconductor topography 20 by the inclusion of well region 102 within semiconductor substrate 22. As denoted by the dual-arrowed link between blocks 80 and 82 in FIG. 24, well region 102 may be formed prior to or subsequent to the formation of either dielectric layer 24 or conductive layer 26.

In general, well region 102 may be formed by implanting a dose of impurities between approximately $1 \times 10^{12}$ ions/cm$^2$ and approximately $5 \times 10^{13}$ ions/cm$^2$ at an energy between approximately 20 keV and approximately 1000 keV, depending on the dopant used and the design specifications of the device. Such dose and energy ranges may generally be sufficient to form well region 102 to a depth between approximately 0.5 microns and approximately 2.0 microns and at a concentration between approximately $2.0 \times 10^{13}$ cm$^{-3}$ and approximately $5.0 \times 10^{18}$ cm$^{-3}$. Wells with larger or smaller depths and/or concentrations, however, may be formed. As such, larger or smaller doses and energies may also be employed for the formation of well region 102 in some embodiments. In general, the dopants used to form well region 102 depends on the type of MOS device being formed and the design specifications of the device. In some embodiments, well region 102 may be the same conductivity type as semiconductor substrate 22. In other embodiments, however, well region 102 may be of the opposite conductivity type as semiconductor substrate 22. In yet other cases, semiconductor substrate 22 may not be doped.

Figure 20:
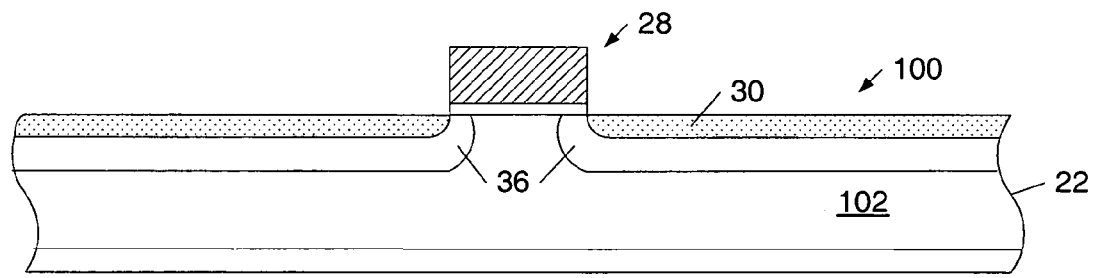
FIG. 20 is a partial cross-sectional view of the semiconductor topography of FIG. 19 subsequent to the patterning of the dielectric layer and the conductive layer into a gate structure and the formation of tip and halo regions within portions of the semiconductor substrate adjacent to the gate structure.
Figure 21:
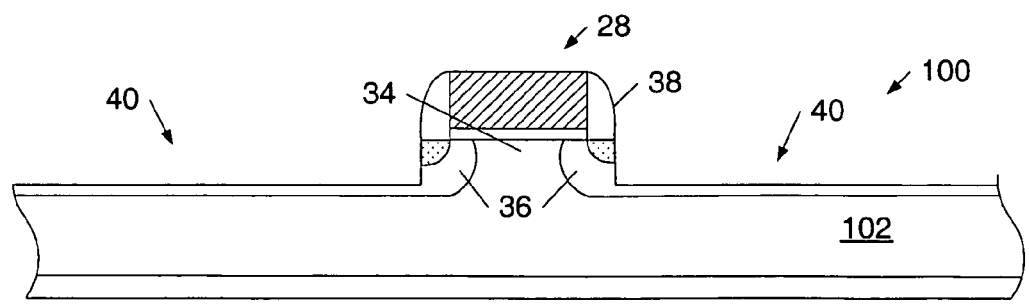
FIG. 21 is a partial cross-sectional view of the semiconductor topography in which sidewall spacers are formed adjacent to the sidewalls of the gate structure and recesses are formed within the semiconductor substrate in alignment with the spacers subsequent to the formation of the tip and halo regions in FIG. 20.

Turning to FIG. 20, conductive layer 26 and, in some embodiments, dielectric layer 24 may be patterned to form gate structure 28 similar to the process described above for the patterning of gate structure 28 in FIG. 2. Such a process is referenced in FIG. 24 as block 50. In addition, tip regions 30 and halo regions 36 may be formed within portions of semiconductor substrate 22 adjacent to gate structure 28 similar to the processes described above in reference to FIGS. 3 and 5, respectively. The implantation of tip dopants and halo dopants to form such regions are noted in blocks 52 and 56, respectively, in FIG. 24. FIG. 24 also includes a dual-arrowed link connecting blocks 52 and 56, indicating the order in which the processes are conducted may be reversed. Subsequent to the formation of the tip regions 30 and halo regions 36, sidewalls spacers 38 may be formed along the sidewalls of gate structure 28 as shown in FIG. 21. Such a process may be similar to the process described above in reference to FIG. 6 and is referenced in FIG. 24 as block 58.

As shown in FIG. 21, recesses 40 may be etched within semiconductor substrate 22 in alignment with sidewall spacers 38 similar to the process described above in reference to FIG. 7. The process of etching recesses within semiconductor substrate is noted in block 60 in FIG. 24. As noted above for semiconductor topography 20, recesses 40 may be formed to a depth within well regions 32, such as to a depth between approximately 100 angstroms and approximately 2000 angstroms. A similar depth range may be employed for the formation of recesses 40 in well regions 102 of semiconductor topography 100. In particular, recesses 40 may be formed to a depth sufficient to expose the portion of halo regions 36 underlying gate structure 28 and may, in some embodiments, extend beyond the lower boundary of halo regions 36. In other embodiments, recesses 40 may be formed within halo regions 36. In either case, semiconductor topography 100 may, in some embodiments, be implanted with additional dopants, such as well dopants and/or halo dopants, subsequent to the formation of recesses 40 as denoted in block 62 in FIG. 24. Such a process may be similar to the process described above in reference to block 62 in FIG. 10 and may increase the concentration of well region 102 and/or the portion of halo region to improve SER and SEL for the ensuing device. As shown in FIG. 24, block 62 is outlined by a dotted line indicating the process is optional and, therefore, may be omitted in some embodiments.

Figure 22:
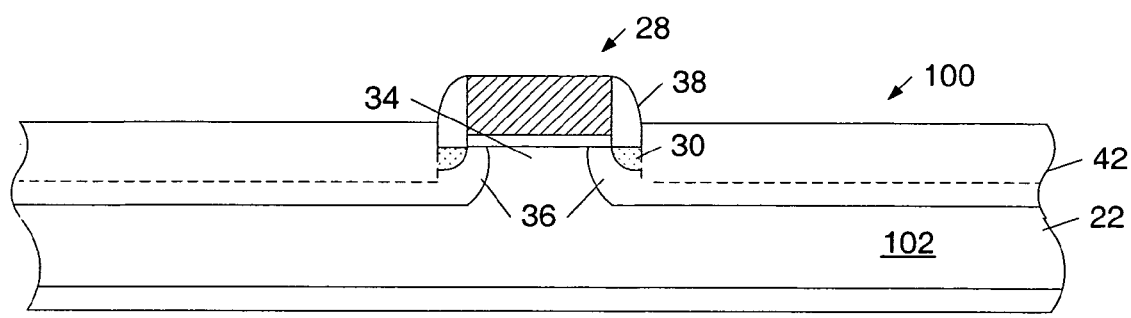
FIG. 22 is a partial cross-sectional view of the semiconductor topography in which an epitaxial layer is formed upon the semiconductor substrate subsequent to the formation of the recesses in FIG. 21.
Figure 23:
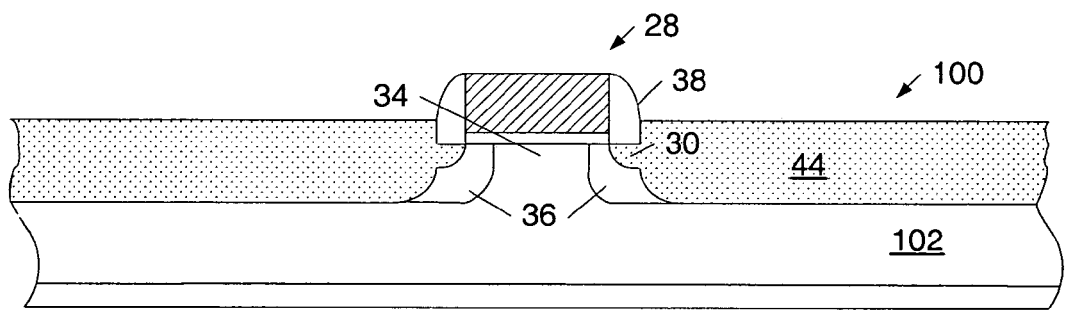
FIG. 23 is a partial cross-sectional view of the semiconductor topography in which source and drain regions are formed within the semiconductor substrate subsequent to the formation of the epitaxial layer in FIG. 22.

Turning to FIG. 22, epitaxial layer 42 may be grown within recesses 40 in a similar manner to the processes described in reference to FIG. 8 above. Such a process is noted in FIG. 24 as block 64. A dotted line outlines the interface between semiconductor substrate 22 and epitaxial layer 42. Subsequent to the growth of epitaxial layer 42, source and drain dopants may be implanted within semiconductor topography 100 to form source and drain regions 44 similar to the process described above in reference to FIG. 9. Such a process is noted in FIG. 24 as block 66. As noted in FIG. 24, an alternative sequence of the steps depicted in FIGS. 19–23 may include the forming the tip regions and sidewall spacers subsequent to the formation of the recesses and epitaxial layer. In particular, blocks 60, 62 and 64 may be performed prior to blocks 52 and 58. A dual-arrow link is connects reference numbers 56 and 60, indicating the formation of the halo regions may be performed prior to or subsequent to the etching of the recesses. In any case, subsequent to the formation of the source and drain regions, the semiconductor topography may be annealed to activate the implanted impurities and eliminate defects created by the previous dopant implantations. The implantation of the source and drain dopants and the subsequent anneal process is described above in reference to FIG. 9.

The advantages of the methods described herein over previous or conventional techniques resolving or preventing the problems associated with ion strike include: (i) greater flexibility of concentration profiles in well regions by controlling several processing conditions, such as well shield implants, recess etch depth, SEG thickness, and source and drain implant conditions and (ii) flexibility in halo implants such that high energy implants may be used to improve transistor performance while keeping junction capacitance low.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A method for processing a semiconductor topography, comprising:

patterning one or more layers of the semiconductor topography to form a gate structure above a semiconductor substrate of the semiconductor topography;

implanting a first set of dopants into the semiconductor topography to form a first dopant region within a portion of the semiconductor substrate adjacent to the gate structure;

etching a recess in the portion of the semiconductor substrate adjacent to the gate structure to a depth within the first dopant region;

growing an epitaxial layer within the recess; and implanting a second set of dopants into the semiconductor topography to form a second dopant region extending to a depth at least within the epitaxial layer.

2. The method of claim 1, wherein the step of implanting the first set of dopants comprises implanting the first set of dopants to form a well region within the portion of the semiconductor substrate adjacent to the gate structure.

3. The method of claim 1, wherein the step of implanting the first set of dopants comprises implanting the first set of dopants to form a halo region within the portion of the semiconductor substrate adjacent to the gate structure.

4. The method of claim 1, further comprising forming spacers along the sidewalls of the gate structure prior to the step of implanting the first set of dopants.

5. The method of claim 1, further comprising forming spacers along the sidewalls of the gate structure subsequent to the step of implanting the first set of dopants and prior to the step of etching the recess.

6. The method of claim 1, further comprising forming spacers along the sidewalls of the gate structure subsequent to the step of growing the epitaxial layer.

7. The method of claim 1, further comprising implanting a third set of dopants into portions of the semiconductor topography bordering the recess prior to the step of growing the epitaxial layer.

8. The method of claim 1, wherein the step of etching the recess comprises etching a recess to a depth between approximately 100 angstroms and approximately 2000 angstroms.

9. The method of claim 1, wherein the step of growing the epitaxial layer comprises growing the epitaxial layer to an elevation up to approximately 1000 angstroms higher than a dielectric layer of the gate structure.

10. The method of claim 1, wherein the step of implanting the first set of dopants consists essentially of:
    implanting boron at a dose between approximately $1 \times 10^{13}$ ions/cm$^2$ and approximately $5 \times 10^{14}$ ions/cm$^2$ and at an energy between approximately 20 keV and approximately 150 keV;
    implanting difluoroborane at a dose between approximately $1 \times 10^{13}$ ions/cm$^2$ and approximately $5 \times 10^{14}$ ions/cm$^2$ and at an energy between approximately 100 keV and approximately 500 keV; or
    implanting indium at a dose between approximately $1 \times 10^{13}$ ions/cm$^2$ and approximately $1 \times 10^{14}$ ions/cm$^2$ and at an energy between approximately 100 keV and approximately 1000 keV.

11. The method according to claim 1, wherein the implanting the first set of dopants consists essentially of:
    implanting phosphorus at a dose between approximately $1 \times 10^{13}$ ions/cm$^2$ and approximately $5 \times 10^{14}$ ions/cm$^2$ and at an energy between approximately 40 keV and approximately 300 keV;
    implanting arsenic at a dose between approximately $1 \times 10^{13}$ ions/cm$^2$ and approximately $5 \times 10^{14}$ ions/cm$^2$ and at an energy between approximately 80 keV and approximately 1000 keV; or
    implanting antimony at a dose between approximately $1 \times 10^{13}$ ions/cm$^2$ and approximately $5 \times 10^{14}$ ions/cm$^2$ and at an energy between approximately 80 keV and approximately 1000 keV.

12. A method for processing a semiconductor topography, comprising:
    patterning one or more layers of the semiconductor topography to form a gate structure above a semiconductor substrate of the semiconductor topography;
    etching a recess in the portion of the semiconductor substrate adjacent to the gate structure;
    implanting a first set of dopants into first portions of the semiconductor substrate bordering the recess;
    growing an epitaxial layer within the recess subsequent to the step of implanting the first set of dopants; and
    implanting a second set of dopants into the semiconductor topography to form a dopant region extending to a depth at least within the epitaxial layer.

13. The method of claim 12, further comprising implanting a third set of dopants of opposite conductivity type of the first set of dopants within second portions of the semiconductor substrate bordering the recess prior to the step of growing the epitaxial layer.

* * * * *

UNITED STATES PATENT AND TRADEMARK OFFICE
CERTIFICATE OF CORRECTION

PATENT NO.      : 7,105,413 B2                         Page 1 of 1
APPLICATION NO. : 11/069501
DATED           : September 12, 2006
INVENTOR(S)     : Nahm et al.

It is certified that error appears in the above-identified patent and that said Letters Patent is hereby corrected as shown below:

IN THE CLAIMS:

Col. 19, line 26: Please delete "$5 \times 10^1$ ions/cm$^2$" and substitute --$5 \times 10^{14}$ ions/cm$^2$--.

Signed and Sealed this

Seventeenth Day of April, 2007

JON W. DUDAS
*Director of the United States Patent and Trademark Office*